(12) United States Patent
Pappas

(10) Patent No.: US 9,214,475 B2
(45) Date of Patent: Dec. 15, 2015

(54) ALL N-TYPE TRANSISTOR INVERTER CIRCUIT

(71) Applicant: Pixtronix, Inc., San Diego, CA (US)

(72) Inventor: Ilias Pappas, Burlington, MA (US)

(73) Assignee: Pixtronix, Inc., San Diego, CA (US)

(*) Notice: Subject to any disclaimer, the term of this patent is extended or adjusted under 35 U.S.C. 154(b) by 73 days.

(21) Appl. No.: 13/937,752

(22) Filed: Jul. 9, 2013

(65) Prior Publication Data

US 2015/0015556 A1 Jan. 15, 2015

(51) Int. Cl.
*G09G 3/20* (2006.01)
*H01L 27/12* (2006.01)
*G09G 3/34* (2006.01)
*G11C 19/28* (2006.01)
*H03K 19/0944* (2006.01)
*H03K 19/017* (2006.01)
*H03K 19/20* (2006.01)

(52) U.S. Cl.
CPC .......... *H01L 27/1225* (2013.01); *G09G 3/3433* (2013.01); *G11C 19/28* (2013.01); *H01L 27/1255* (2013.01); *H03K 19/01714* (2013.01); *H03K 19/09441* (2013.01); *H03K 19/20* (2013.01); *G09G 2310/0267* (2013.01); *G09G 2310/0286* (2013.01); *G09G 2310/0291* (2013.01); *G09G 2330/021* (2013.01)

(58) Field of Classification Search
CPC .............. G09G 2310/0286; G09G 2310/0291; G09G 2310/021
USPC .................................................. 345/211, 204
See application file for complete search history.

(56) References Cited

U.S. PATENT DOCUMENTS 6,356,099 B1 * 3/2002 Lee .................... H03K 3/3565
326/24
6,975,142 B2 12/2005 Azami et al.
(Continued)

FOREIGN PATENT DOCUMENTS

JP 2011228798 A * 11/2011

OTHER PUBLICATIONS

Hwang T.H., et al., "Inverters Using Only N-Type Indium Gallium Zinc Oxide Thin Film Transistors for Flat Panel Display Applications," Japanese Journal of Applied Physics, vol. 50, 2011, pp. 03CB06-1-03CB06-4.
(Continued)

*Primary Examiner* — Carolyn R Edwards
(74) *Attorney, Agent, or Firm* — Edward A. Gordon; Foley & Lardner LLP

(57) ABSTRACT

This disclosure provides systems, methods and apparatus for an all n-type transistor inverter circuit. A circuit can include an input thin film transistor (TFT), a pull-down TFT, a discharge TFT, a first pull-up TFT, a second pull-up TFT, and a floating capacitor. The circuit also can include first and second low-voltage voltage sources and first and second high-voltage voltage sources. The TFTs, the capacitor, and the voltage sources can be coupled such that an output of the circuit is the logical opposite of an input of the circuit. In some implementations, the circuit can exhibit zero DC current in both logic states and can output voltages substantially equal to the voltage output by the first low-voltage voltage source and the second high-voltage voltage source. In some implementations, the circuit can be used to construct D flip-flops, buffers, and controllers for an active matrix electronic display.

16 Claims, 9 Drawing Sheets

(56) References Cited

U.S. PATENT DOCUMENTS

| | | |
|---|---|---|
| 7,091,749 B2 | 8/2006 | Miyake et al. |
| 7,202,863 B2 | 4/2007 | Kimura et al. |
| 8,102,357 B2 | 1/2012 | Kajiwara et al. |
| 2003/0011584 A1* | 1/2003 | Azami ................ G09G 3/3258 345/204 |
| 2003/0048370 A1 | 3/2003 | Koyama |
| 2007/0146290 A1 | 6/2007 | Hirama |
| 2010/0053041 A1 | 3/2010 | Abe et al. |
| 2011/0275412 A1* | 11/2011 | Khawand ............ G06F 3/04847 455/566 |
| 2012/0062533 A1 | 3/2012 | Tsai |
| 2012/0223930 A1* | 9/2012 | Yamamoto ............... G09G 3/00 345/211 |
| 2013/0173870 A1 | 7/2013 | Tseng et al. |

OTHER PUBLICATIONS

International Search Report—PCT/US2014/043432—ISA/EPO—Sep. 17, 2014.

* cited by examiner

ALL N-TYPE TRANSISTOR INVERTER CIRCUIT

TECHNICAL FIELD

This disclosure relates to semiconductor circuit design, and in particular, to all n-type transistor circuits.

DESCRIPTION OF THE RELATED TECHNOLOGY

Current thin-film metal oxide semiconductor (MOS) circuitry, for example, indium gallium zinc oxide (IGZO) based circuitry, suffers from the lack of readily available p-mos transistors. As such, common complementary metal oxide semiconductor (CMOS) digital circuits, such as inverters, buffers, and various logical gates, which are available in ordinary silicon circuits, are not available for metal oxide-based thin-film processes. Replacement circuits fabricated from all n-type transistors have been proposed for such CMOS components, but most, if not all, suffer from various shortcomings. For example, certain proposed IGZO inverters suffer from standing currents in at least one logic state. Some proposed IGZO inverters also lack full rail-to-rail voltage swings. As a result, higher voltage sources are needed to obtain desired voltage outputs.

SUMMARY

The systems, methods and devices of the disclosure each have several innovative aspects, no single one of which is solely responsible for the desirable attributes disclosed herein.

One innovative aspect of the subject matter described in this disclosure can be implemented in an all n-type thin film transistor (TFT) circuit. The circuit can include a first inverter. The first inverter can include an input voltage interconnect. The first inverter can include an input TFT coupled at its gate to the input voltage interconnect and to a first low voltage source at its source. The first inverter can include a pull-down TFT coupled to the input voltage interconnect at its gate and a second low voltage source at its source. The first inverter can include a discharge TFT coupled to the input voltage interconnect at its gate and a third low voltage source at its source. The first inverter can include a first pull-up TFT coupled from its source to the drain of the pull-down TFT and a first terminal of a capacitor, from its gate to the drain of the input TFT and a second terminal of the capacitor, and from its drain to a first high voltage source. The first inverter can include a second pull-up TFT coupled from its source to the drain of the discharge TFT, from its gate to the source of the first pull-up transistor and to the first terminal of a first capacitor and the drain of the pull-down TFT, and from its drain to a second high voltage source. The first inverter can include an output voltage interconnect coupled to a node between the second pull-up TFT and the discharge TFT.

In some implementations, the second low voltage source outputs a voltage that is more negative than a voltage output by first low voltage source. In some implementations, the first low voltage source is a ground. In some implementations, the first high voltage source outputs a voltage that is more positive than a voltage output by the second high voltage source. In some implementations, the first, second, and third low voltage sources and the first and second high voltage sources are DC voltage sources.

In some implementations, the input TFT, the pull-down TFT, the discharge TFT, and the first and second pull-up TFTs are configured such that the voltage on the output voltage interconnect is the logical opposite of the voltage on the input voltage interconnect. In some implementations, the capacitor is a floating capacitor. In some implementations, the absolute value of the difference between a logical low input voltage and the voltage output by the second low voltage source is less than the threshold voltage of the first pull-up TFT.

In some implementations, the logical low input voltage is equal to about the voltage output by the first low voltage source and the high input voltage is equal to the voltage output by the second high voltage source. In some implementations, at least one of the input TFT, the pull-down TFT, the discharge TFT, the first pull-up TFT and the second pull-up TFT include a channel formed from a conductive oxide. In some implementations, the voltage output by the first low voltage source is about equal to the voltage output by the third low voltage source. In some implementations, the circuit includes a second inverter. The output voltage interconnect of the first inverter can be electrically coupled to an input voltage interconnect of the second inverter such that the first and second inverters together operate as a buffer.

In some implementations, the circuit includes a sixth TFT coupled at its gate to a trigger signal, at its drain to a data input interconnect, and at its source to the input voltage interconnect of the first inverter. The circuit can include a second inverter coupled at its input voltage interconnect to the output voltage interconnect of the first inverter, and at its output voltage interconnect to the input voltage interconnect of the first inverter. The circuit can include a seventh transistor coupled at its gate to an inverted trigger signal and at its drain to the output voltage interconnect of the first inverter circuit. The circuit also can include a third inverter coupled at its input voltage interconnect to the source of the seventh transistor and the output voltage interconnect of a fourth inverter, and at its output voltage interconnect to the input voltage interconnect of the fourth inverter. The first inverter, the second inverter, the third inverter, the fourth inverter, the sixth transistor, and the seventh transistor can form a D flip-flop.

In some implementations, the circuit can include a display and a processor that is configured to communicate with the display. The processor can be configured to process image data. The circuit also can include a memory device that is configured to communicate with the processor. In some implementations, the circuit also can include a driver circuit configured to send at least one signal to the display and a controller configured to send at least a portion of the image data to the driver circuit. In some implementations, the circuit also can include an image source module configured to send the image data to the processor. The image source module can include a receiver, transceiver, or transmitter. The circuit also can include an input device configured to receive input data and to communicate the input data to the processor.

Another innovative aspect of the subject matter described in this disclosure can be implemented in an apparatus for controlling an electronic display. The apparatus can include a plurality of D flip-flops each coupled in series to a respective buffer circuit to form a plurality of row drivers. The plurality of D flip-flops and the respective buffer circuits can be formed from all n-type TFTs. The apparatus also can include a trigger signal interconnect coupled in parallel to each of the D flip-flops for transmitting a trigger signal. The output of each D flip-flop can be coupled to the input of a subsequent D flip-flop and the input to the row driver corresponding to a first row of the electronic display is coupled to an independently controlled input, such that the outputs of the buffer circuits are enabled sequentially during successive cycles of the trigger signal in response to a logical high voltage being applied at the independently controlled input. The apparatus also can include a control matrix having a plurality of scan-line interconnects. Each scan-line interconnect can be coupled to a respective buffer circuit and a plurality of display elements arranged substantially in a row.

In some implementations, the apparatus also can include a substrate. TFTs forming the D flip-flops, the buffer circuits, and the control matrix can be fabricated on the substrate. In some implementations, the apparatus can include a controller for outputting the independently controlled input. The independently controlled input can initiate a display addressing process. In some implementations, the apparatus also can include a data driver for sequentially outputting data voltages to display elements in rows enabled by corresponding scan-line interconnects. The controller can output signals to synchronize the outputs of the data driver and the buffer circuits.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCDs), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
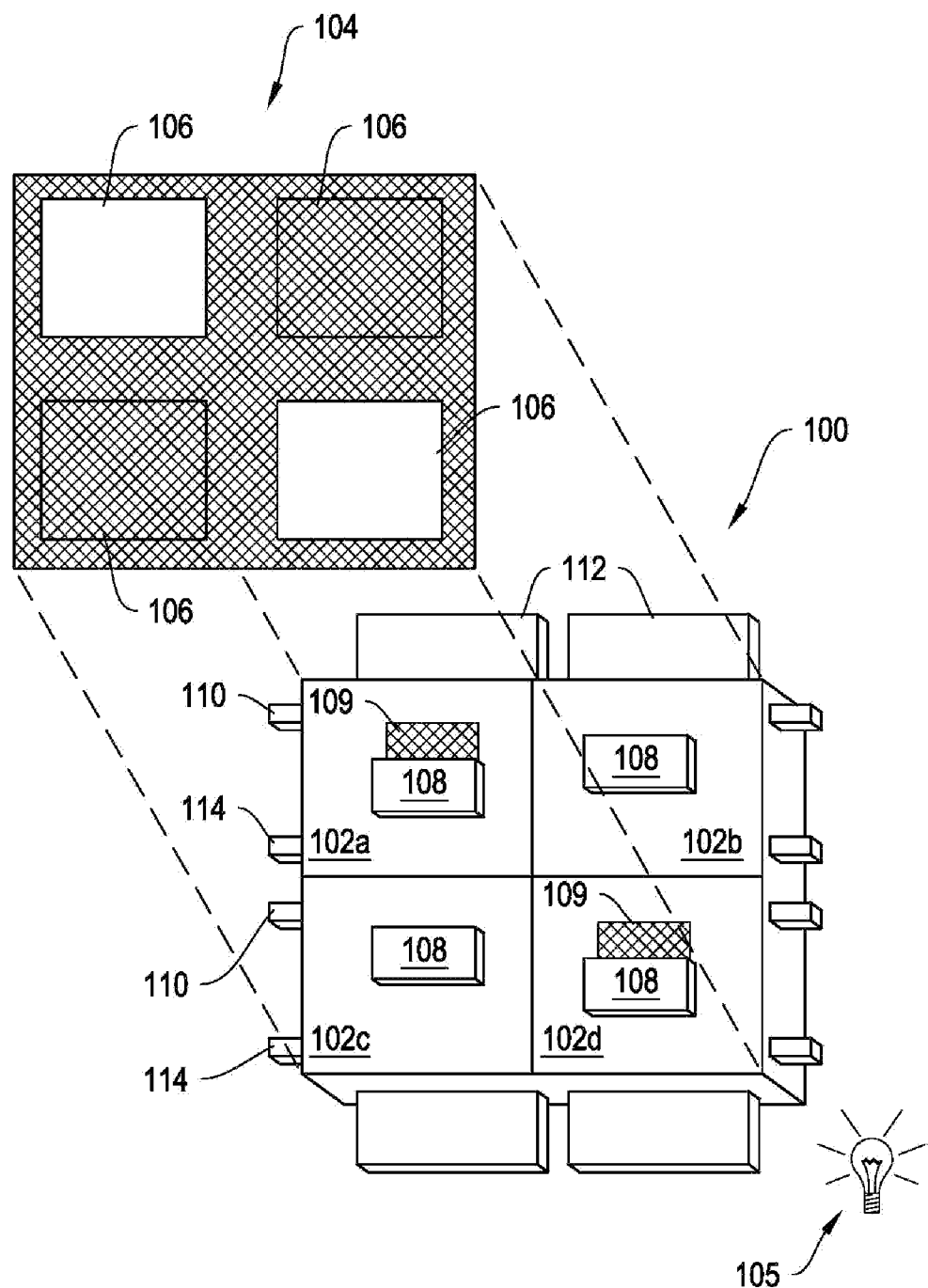
FIG. 1A shows a schematic diagram of an example direct-view microelectromechanical system (MEMS) based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

An all n-type transistor inverter can be fabricated with rail-to-rail output voltage switching, and which lacks standing currents in both logic states, through appropriate incorporation of a floating capacitor. More particularly, a floating capacitor can be incorporated into an inverter circuit such that one terminal of the floating capacitor couples in parallel to the drain of an input transistor and the gate of a first pull-up transistor. The other terminal of the capacitor couples in parallel to the source of a first pull-up transistor, the gate of a second pull-up transistor, and the drain of a pull-down transistor.

In addition, the sources of the pull-down transistor and the input transistor are coupled to two low-voltage voltage sources. The voltage source coupled to the pull-down transistor is more negative than the voltage source coupled to the input transistor and the discharge transistor. The absolute value of the difference in the respective voltages of these low-voltage voltage sources is greater than the threshold voltage of the first pull-up transistor.

Particular implementations of the subject matter described in this disclosure can be implemented to realize one or more of the following potential advantages. An inverter circuit can be configured to output voltages that are substantially equal to the voltages output by power supplies that are electrically coupled to the inverter circuit. This rail-to-rail performance characteristic of the inverter circuit allows voltage sources to be selected such that the voltage of a high-voltage voltage source corresponds to the voltage of a logical 1 and the voltage of a low-voltage voltage source corresponds to the voltage of a logical 0. The voltage source voltages can be maintained within a narrower range than would be possible in a circuit lacking rail-to-rail output characteristics, as is the case with many alternative circuit designs. Therefore, a rail-to-rail inverter circuit results in reduced power consumption. Because the inverter circuit can be used to implement any form of logic gate, a system capable of performing other logic operations can be constructed to take advantage of the power savings associated with the rail-to-rail inverter circuit.

In some implementations, the inverter circuit described herein can further reduce power consumption by eliminating standing currents during normal operation of the circuit. For example, an inverter circuit can include a pull-up transistor coupled to a high-voltage source and a discharge transistor coupled to a low voltage source. The pull-up and discharge transistors can be turned ON and OFF to switch the output of the inverter between high and low logic states. By designing the circuit such that there are no circumstances in which the pull-up transistor and the discharge transistor are both simultaneously ON, which would form a DC current path from the high voltage source to the low voltage source, power can be conserved.

In some implementations, an inverter circuit can be designed to reduce the complexity and cost of production of devices incorporating the inverter circuit. For example, an electronic display can include an active layer made from a conductive oxide, such as indium gallium zinc oxide (IGZO), zinc oxide (ZnO), tin oxide (SnO), zinc tin oxide (ZnSnO), aluminum zinc oxide (AlZnO), copper oxide (CuO or $Cu_2O$), cadmium oxide (CdO), or silver antimony oxide ($AgSbO_3$) from which display element control circuits are formed. In addition to display elements and their control circuits, it is useful to incorporate drivers and/or logic functionality into the display. Typically, such drivers and/or logic are fabricated as separate components, which are coupled to the display substrate. Using the all n-type transistor inverters disclosed herein, drivers and other logic circuits can be fabricated directly on the display substrate in the same process used to fabricate the display element control circuits.

FIG. 1A shows a schematic diagram of an example direct-view MEMS-based display apparatus 100. The display apparatus 100 includes a plurality of light modulators 102a-102d (generally light modulators 102) arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide a luminance level in an image 104. With respect to an image, a pixel corresponds to the smallest picture element defined by the resolution of image. With respect to structural components of the display apparatus 100, the term pixel refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or backlight so that each pixel can be uniformly illuminated. Transmissive direct-view displays are often built onto transparent or glass substrates to facilitate a sandwich assembly arrangement where one substrate, containing the light modulators, is positioned over the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (such as interconnects 110, 112 and 114), including at least one write-enable interconnect 110 (also referred to as a scan-line interconnect) per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the write-enabling voltage, $V_{WE}$), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
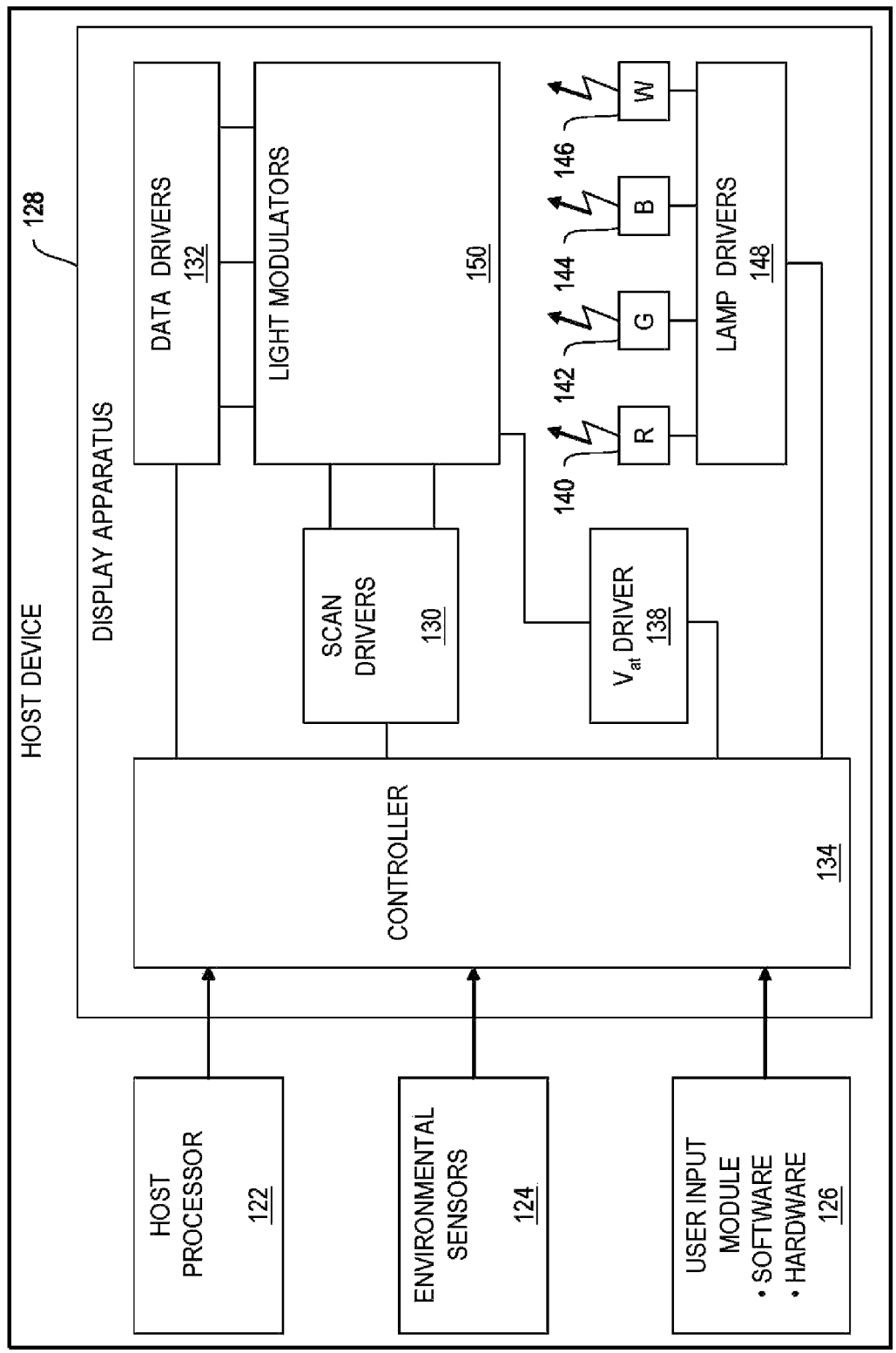
FIG. 1B shows a block diagram of an example host device.

FIG. 1B shows a block diagram of an example host device 120 (i.e., cell phone, smart phone, PDA, MP3 player, tablet, e-reader, netbook, notebook, watch, etc.). The host device 120 includes a display apparatus 128, a host processor 122, environmental sensors 124, a user input module 126, and a power source.

The display apparatus 128 includes a plurality of scan drivers 130 (also referred to as write enabling voltage sources), a plurality of data drivers 132 (also referred to as data voltage sources), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the controller 134). The controller sends data to the data drivers 132 in a mostly serial fashion, organized in sequences, which may be predetermined, grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (such as scan drivers 130, data drivers 132 and common drivers 138) for different display functions are time-synchronized by the controller 134. Timing commands from the controller coordinate the illumination of red, green, blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, blue and white. The image frames for each respective color are referred to as color subframes. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, blue and white.

In some implementations, where the display apparatus 100 is designed for the digital switching of shutters 108 between open and closed states, the controller 134 forms an image by the method of time division grayscale, as previously described. In some other implementations, the display apparatus 100 can provide grayscale through the use of multiple shutters 108 per pixel.

In some implementations, the data for an image 104 state is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations, the sequencing is organized by blocks, where, for a block, the data for only a certain fraction of the image 104 state is loaded to the array 150, for instance by addressing only every $5^{th}$ row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as deeper color, better contrast, lower power, increased brightness, sports, live action, or animation. In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
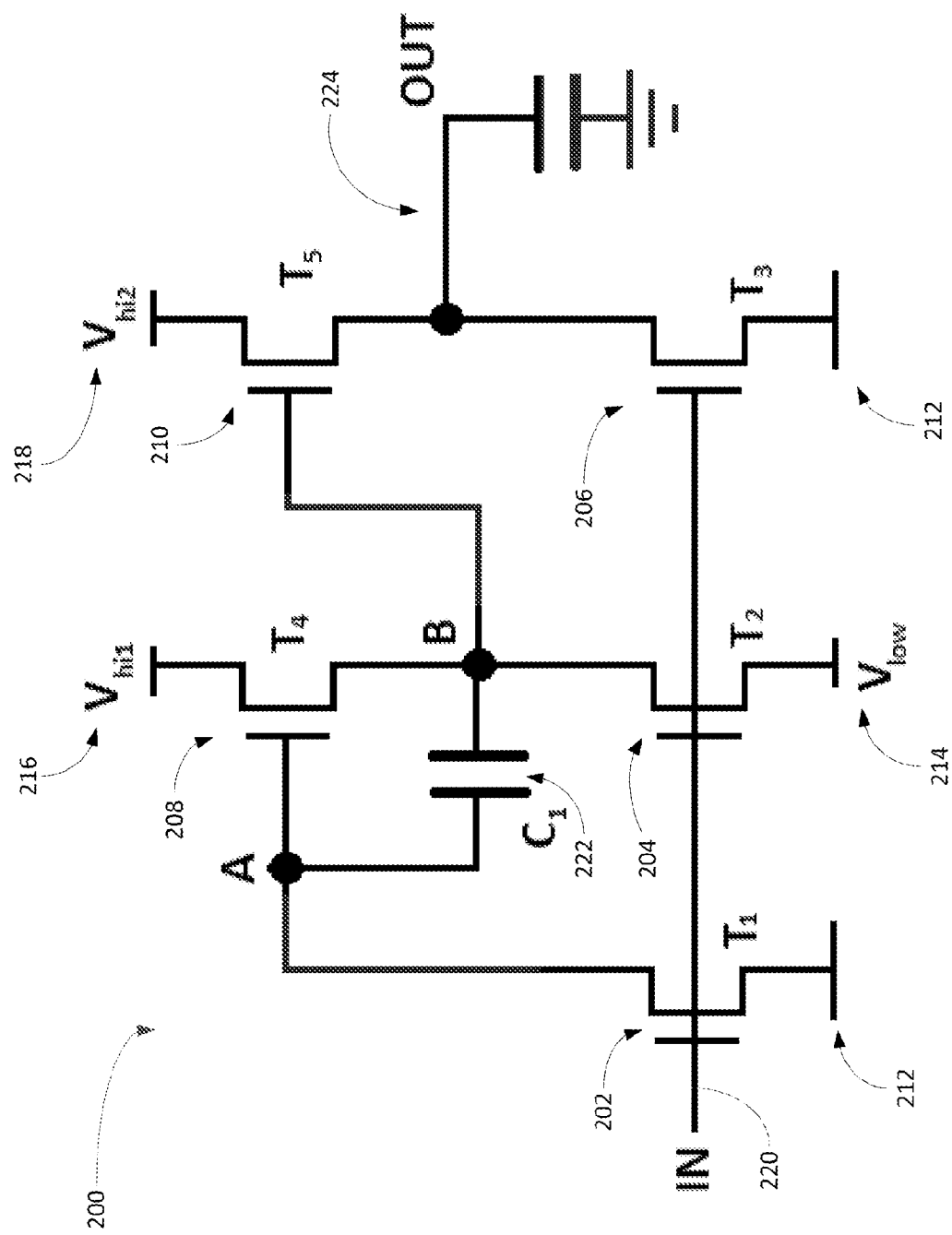
FIG. 2 shows a circuit diagram of an example inverter circuit.

FIG. 2 shows a schematic diagram of an example inverter circuit 200. The inverter circuit 200 includes five thin-film transistors (TFTs) 202 ($T_1$), 204 ($T_2$), 206 ($T_3$), 208 ($T_4$) and 210 ($T_5$). Coupled to the TFTs 202, 204, 206, 208 and 210 are a first low-voltage source 212, a second low-voltage source 214 ($V_{low}$), a first high-voltage source 216 ($V_{hi1}$) and a second high-voltage source 218 ($V_{hi2}$). The inverter circuit 200 also includes an input voltage interconnect 220, a capacitor 222 ($C_1$) and an output voltage interconnect 224.

The inverter circuit 200 includes an input TFT 202, a pull-down TFT 204, a discharge TFT 206, a first pull-up TFT 208 and a second pull-up TFT 210. In some implementations, each of the TFTs 202, 204, 206, 208 and 210 are n-type TFTs. For example, the inverter circuit 200 can be a conductive oxide (such as IGZO, ZnO, SnO, ZnSnO, AlZnO, CuO, $Cu_2O$, CdO, or $AgSbO_3$) circuit using all n-type transistors. In some implementations, the inverter circuit 200 can be a component of an electronic display. The electronic display also can include other conductive oxide circuitry, such as a control matrix for controlling shutter-based display elements, which are formed during the same fabrication process in which the inverter circuit 200 is formed.

The source of the input TFT 202 couples to the first low voltage source 212. The input TFT 202 gate couples to an input voltage interconnect 220 and in parallel to the gates of the pull-down TFT 204 and the discharge TFT 206. The drain of the input TFT 202 couples, in parallel to the gate of the first pull-up TFT 208 and a first terminal of the capacitor 222.

The source of the pull-down TFT 204 couples to the second low voltage source 214, which in some implementations may be the more negative low voltage source. The pull-down TFT 204 gate is coupled to the input voltage interconnect 220 and, in parallel, to the gates of the discharge TFT 206 and the input TFT 202. The drain of the pull-down TFT 204 is coupled in parallel to a second terminal of the capacitor 222, the source of the first pull-up TFT 208, and the gate of the second pull-up TFT 210.

The source of the discharge TFT 206 is coupled to the first low voltage source 212. The discharge TFT 206 gate is coupled to the input voltage interconnect 220 and in parallel to the gates of the pull down TFT 204 and the input TFT 202. The discharge TFT 206 drain is coupled, in parallel, to the source of the second pull-up TFT 210 and an output voltage interconnect 224.

The first pull-up TFT 208 is coupled at its gate, in parallel, to the drain of the input TFT 202 and the first terminal of the capacitor 222. The first pull-up TFT 208 drain is coupled to the first high voltage source 216, and the first pull-up TFT 208 source is coupled in parallel to the second terminal of the capacitor 222, the drain of the pull-down TFT 204, and the gate of the second pull-up transistor 210.

The second pull-up TFT 210 is coupled at its drain to the second high voltage source 218. The second pull-up TFT 210 source is coupled in parallel to the output interconnect 224 and the drain of the discharge transistor 206. The second pull-up TFT 210 gate is coupled, in parallel, to the source of the first pull-up TFT 208, the second terminal of the capacitor 222, and the drain of the pull-down TFT 204.

With respect to the low voltage sources 212 and 214, in some implementations, the second low voltage source 214 outputs a voltage which is more negative than the voltage output by the first low voltage source 212. Furthermore, with respect to the high voltage sources 216 and 218, the first high voltage source 216 outputs a voltage which is more positive than the voltage output by the second high voltage source 218. In some implementations, the first low voltage source 212 can be connected to ground. In some other implementations, the first low voltage source 212 can provide another voltage, other than ground. For example, in some implementations the first low voltage source 212 can output a voltage equal to the voltage output by the second low voltage source 214. The voltage output by the first low voltage source 212 is equal to about the voltage used by the inverter circuit 200 as a logical 0. In some implementations, the voltage output by the second low voltage source 214 is selected such that the absolute value of the difference between the voltage it outputs and the voltage value of a logical 0 is less than the threshold voltage of the first pull-up TFT 208. The first high voltage source 216, in some implementations, outputs a voltage which is more positive than the voltage output by the second high voltage source 218.

When a logical 1 is applied to the input voltage interconnect 220, the input TFT 202, the pull-down TFT 204, and the discharge TFT 206 all turn ON. As a result, the first pull-up TFT 208 turns OFF, and a voltage about equal to the voltage output by the second low voltage source 212 is stored on the capacitor 222 and on the gate of the second pull-up TFT 210, turning it OFF, as well. Any voltage stored on the output voltage interconnect 224 is discharged through the discharge TFT 206, resulting in a voltage about equal to a logical 0 on the output voltage interconnect 224.

Subsequently, when voltage on the input voltage interconnect 220 is lowered to a logical 0, the input TFT 202, the pull-down TFT 204, and the discharge TFT 206 turn OFF, electrically isolating the capacitor 222 from a voltage source. As a result, the capacitor 222 behaves as a floating capacitor. However, in turning OFF the input TFT 202, the pull-down TFT 204, and the discharge TFT 206, the node in the circuit labeled as B experiences a momentary voltage spike due to the input voltage interconnection 220 feed through. In some implementations, the pull down TFT 204 is selected to be of a larger size than the input TFT 202. As a result, the feedthrough of the input signal has a greater effect on node B than on node A. This voltage spike, due to the asymmetrical input signal feed through combined with a bootstrapping effect on the capacitor 222, which already has a voltage stored on it equal to the difference between the voltage output by the first low voltage source 212 and the second low voltage source 214, momentarily raises the voltage on the gate of the first pull-up TFT 208, across the capacitor 222, sufficiently high to turn ON the first pull-up TFT 208. This further raises the voltage on the node B to about the voltage output by the first high-voltage source 216.

Because the capacitor 222 is floating, this increase in voltage at node B further increases the voltage across the capacitor 222 on the gate of the first pull-up TFT 208, keeping it ON. The increased voltage at B also turns ON the second pull-up TFT 210. The voltage at the gate of the second pull-up TFT 210 is equal to about the voltage output by the first high voltage source 216, which exceeds the voltage output by the second high voltage source 218 by at least the threshold voltage of the second pull-up transistor 210. As a result, the voltage on the output voltage interconnect 224 is raised to about the voltage output by the second high voltage source 218 when the second pull-up TFT 210 is turned ON, thereby providing rail-to-rail operation for the inverter circuit 200.

Thus, as shown above, an application of a logical 0 to the inverter circuit 200 results in a voltage output equivalent of a logical 1. Conversely, the introduction of a logical 1 to the inverter circuit 200 results in an output voltage corresponding to a logical 0. In addition, because there are no circumstances in which either of the pull-up TFTs 208 and 210 are ON at the same time as either the pull-down TFT 204 or the discharge TFT 206, the circuit includes no direct DC current paths from either of the high voltage sources 216 or 218 to either of the low voltage sources 212 or 214 that would consume additional power during operation.

Figure 3:
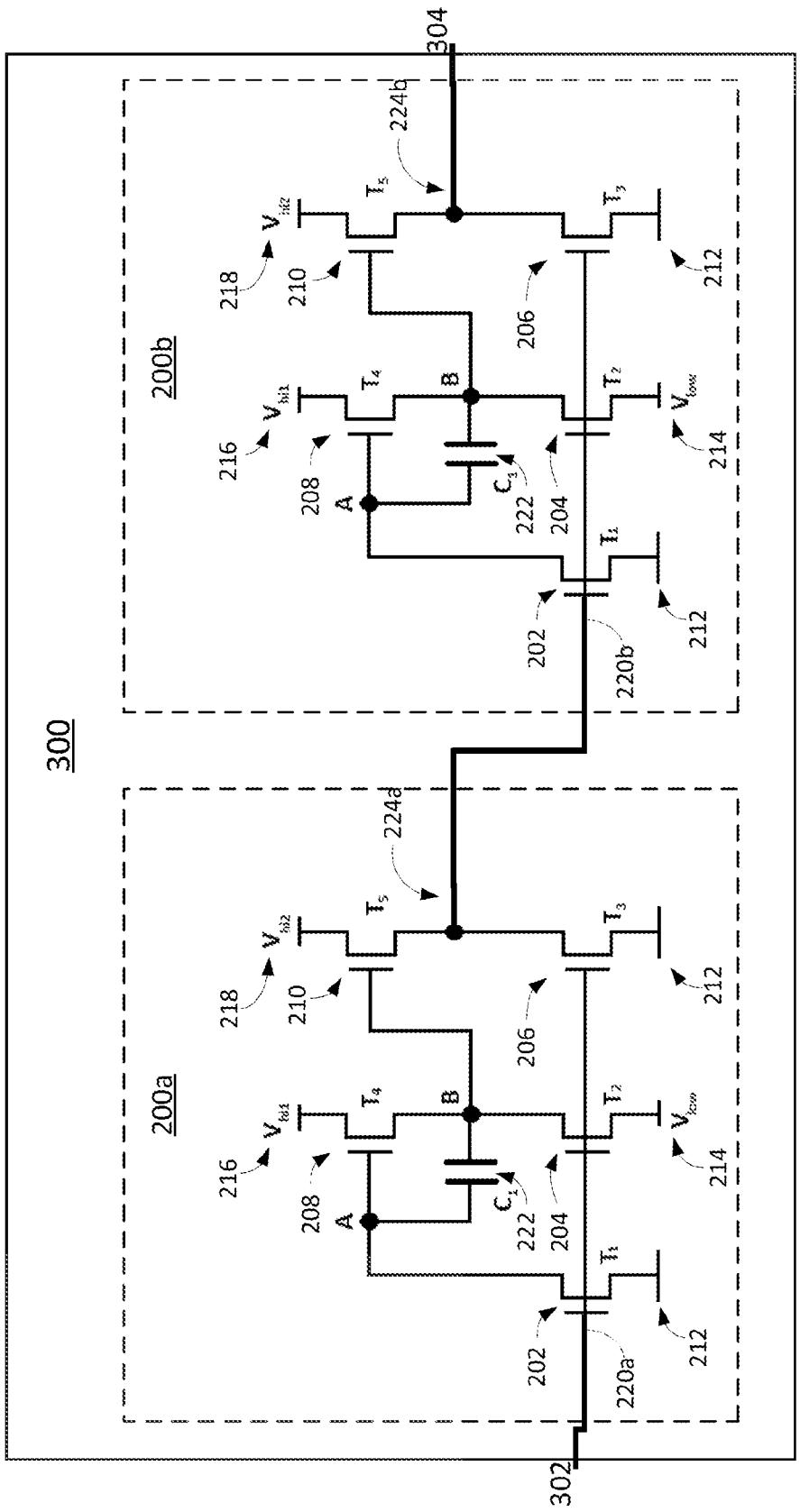
FIG. 3 shows a circuit diagram of an example buffer circuit.

FIG. 3 shows a circuit diagram of an example buffer circuit 300. In some implementations, the buffer circuit 300 can be implemented using the inverter circuit 200 shown in FIG. 2. The buffer circuit 300 includes two inverter circuits 200a and 200b connected in series. An input 302 is coupled to the input 220a of the first inverter circuit 200a, and an output 304 is coupled to the output 224b of the second inverter circuit 200b. The output 224a of the first inverter circuit 200a is coupled to the input 220b of the second inverter circuit 200b.

When a voltage corresponding to a logical 1 is applied to the input 302, the first inverter 200a operates as described above in connection with FIG. 2 to produce a voltage corresponding to a logical 0 at its output 224a. The logical 0 then becomes the input to the second inverter circuit 200b, which inverts the signal to produce a logical 1 at its output 224b, as described above. Thus, applying a logical 1 to the input 302 results in a logical 1 at the output 304.

Similarly, when a voltage corresponding to a logical 0 is applied to the input 302, the first inverter 200a inverts the signal to produce a voltage corresponding to a logical 1 at its output 224a. The logical 1 then becomes the input to the second inverter circuit 200b, which inverts the signal to produce a logical 0 at its output 224b, as described above. Therefore, applying a logical 0 to the input 302 results in a logical 0 at the output 304.

The buffer circuit 300 is configured to output a voltage equal to its input voltage when the input is voltage corresponds to a logical 1 or 0. There is no direct current path between the input 302 and the output 304. The buffer circuit 300 is therefore useful for eliminating loading effects associated with mismatched impedances of circuit components.

The buffer circuit 300 can be used to achieve many of the benefits associated with the inverter circuit 200 shown in FIG. 2. For example, the buffer circuit 300 can be fabricated using only n-type transistors (including conductive oxide, amorphous silicon (a-Si), or low temperature poly-silicon (LTPS) n-type transistors). A similar, complementary circuit could be implemented using all p-type transistors. In some implementations, the buffer circuit can be included in an electronic display, and can be fabricated in the same manufacturing process as the display elements. In addition, the buffer circuit 300 does not include any standing DC current paths in either logical state, resulting in power savings during normal operation.

Figure 4:
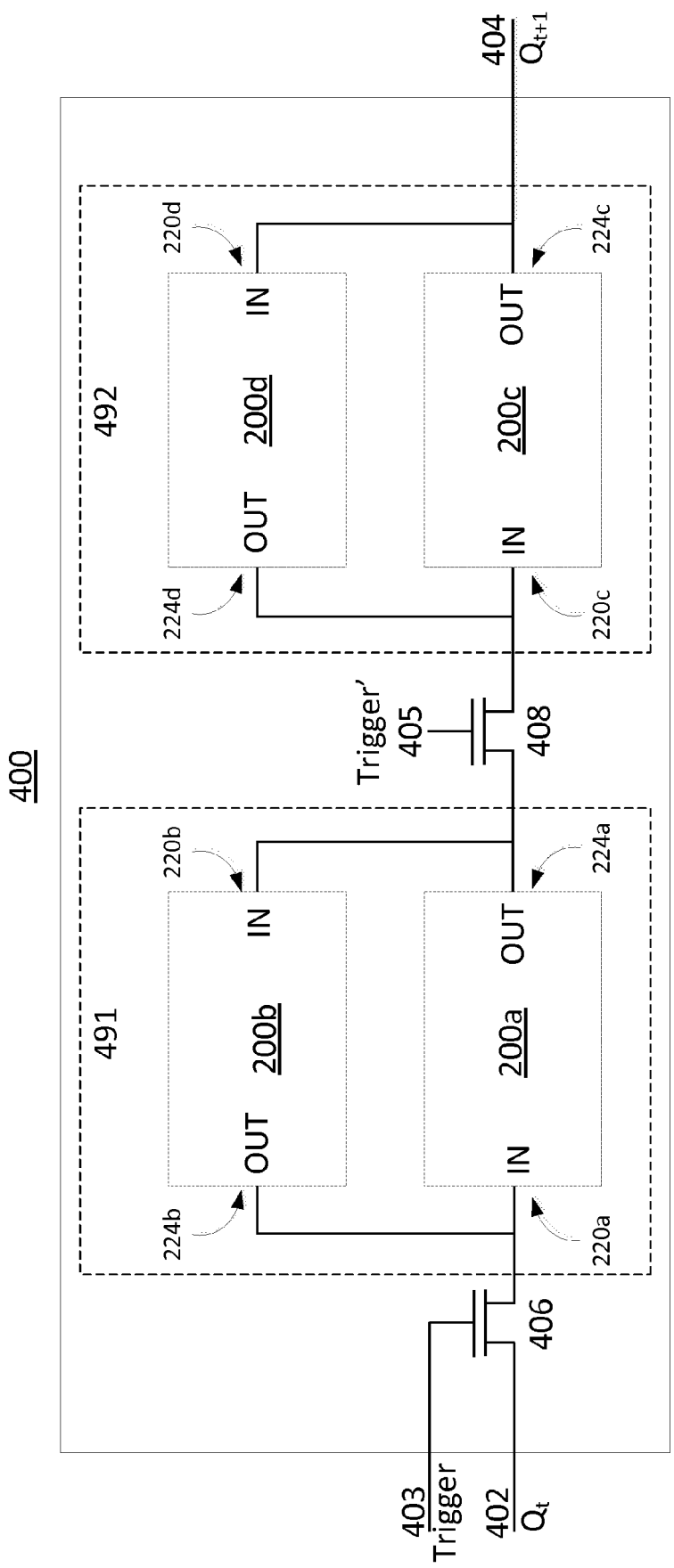
FIG. 4 shows a block diagram of an example D flip-flop circuit.

FIG. 4 shows a block diagram of an example D flip-flop (DFF) circuit 400. The DFF circuit 400 is implemented using the inverter circuit 200 shown in FIG. 2. The DFF circuit 400 includes four inverter circuits 200a-200d and two transistors 406 and 408. In some implementations, the transistors 406 and 408 can be n-type transistors similar to the transistors included in the inverter circuit 200 shown in FIG. 2. Each inverter circuit 200 includes a respective input 220a-220d and an output 224a-224d. Inputs to the DFF circuit 400 include a data signal 402 ($Q_t$), a trigger signal 403, which acts as an enable input, and a trigger' signal 405, which is an inversion of the trigger signal 403. The DFF circuit 400 also includes an output signal 404 ($Q_{t+1}$).

In general, the DFF circuit 400 serves as a digital memory element. The DFF circuit 400 can store a logic value of its data signal 402 input. The logic value can be stored for an arbitrary length of time, and the DFF circuit 400 can output the stored logic value on the output signal 404 at the end of the arbitrary time delay. For example, at time t, a logical 1 can be applied on the input signal 402. The DFF circuit can store the logical 1, and can output the stored value (i.e., a logical 1) on the output signal 404 at time t+1. In some implementations, the transition from time t to time t+1 can be controlled by the trigger signal 403. The trigger signal 403 can be a clock signal and the transition from time t to time t+1 can occur at the rising edge of the clock signal. Therefore, the DFF circuit 400 can output a new stored value at regular repeating intervals. In some other implementations, the trigger signal can be another digital signal with rising edges that do not necessarily occur at regular intervals. More particularly, when the data signal 402 is a digital value $Q_t$ (i.e., a logical 1 or 0) at the rising edge of the trigger signal 403 at time t, the DFF circuit 400 stores the inversion of the value $Q_t$ of the data signal 402 at the output 224a of the inverter circuit 200a. The value output by the inverter 200a is also an input to the inverter circuit 200b. As a result, the output value is stored in the inverter loop 491 that includes inverter circuits 200a and 200b. On the subsequent cycle of the trigger signal 403, at time t+1, the value at the output 224a (i.e., the inversion of the input value $Q_t$) of the inverter circuit 200a is applied to the input 220c of the inverter circuit 200c. The inverter circuit 200c inverts this value so that the original value of $Q_t$ is present at the output 224c of the inverter circuit 200c. The value at the output 224c of the inverter circuit 200c becomes the output signal 404. Accordingly, the DFF circuit 400 outputs a value $Q_{t+1}$ as the output signal 404 that is equal to the logic value $Q_t$. The value of the output signal 404 continues to retain that same value until one trigger signal cycle after a new value is loaded into the DFF circuit 400.

As indicated above, the trigger signal 403 acts as an enable input for the DFF circuit 400. That is, the trigger signal 403 enables the DFF circuit 400 to latch a new data value corresponding to the voltage of the data signal 402. More particularly, when the trigger signal 403 is a logical 1 (and thus the trigger' signal 405 is a logical 0), the transistor 406 is turned ON and the transistor 408 is turned OFF. The logical value $Q_t$ of the data signal 402 is thus presented to the input 220a of the inverter 200a. The inverter circuit 200a is cross coupled with the inverter circuit 200b to form a first inverter loop 491. As a result, the value $Q_t$ of the data signal 402 is stored in the first inverter loop 491 after the trigger signal 403 switches to a logical 0, and the input 220a of the inverter 200a is isolated from the data signal 402.

The change of the trigger signal 403 from a logical 0 to a logical 1 coincides with a change of the trigger' signal 405 from a logical 1 to a logical 0. At this time, the transistor 408 is turned ON and the transistor 406 is turned OFF. The data value $Q_t$ stored in the first inverter loop 491 passes to the input 220c of the inverter 200c (as the inversion of $Q_t$). The inverter 200c is cross coupled with the inverter 200d to form a second inverter loop 492. The data value $Q_t$ is thus stored on the second inverter loop 492 one trigger signal 403 cycle after it is present on the data signal 402. The second inverter loop is coupled to the output 404.

In some implementations, the trigger signal 403 is a clock signal that oscillates between voltages corresponding to a logical 1 and a logical 0 at regular intervals. In some implementations, the voltage corresponding to a logical 1 is sufficient to turn ON the transistors 406 and 408 when applied to the respective gates of the transistors 406 and 408. In some other implementations, the trigger signal 403 is a digital signal that changes states at irregular intervals, for example in response to one or more logic operations. The trigger' signal 405 applied to the gate of the transistor 408 is an inversion of the trigger signal 403 applied to the gate of the transistor 406. Thus, when the trigger signal 403 is a logical 1, the trigger' signal 405 is a logical 0. Similarly, when the trigger signal 403 is a logical 0, the trigger' signal 405 is a logical 1. In some implementations, the trigger' signal 405 can be generated by applying the trigger signal 403 to an inverter circuit such as the inverter circuit 200 shown in FIG. 2.

In some implementations, the transistors 406 and 408 are n-type transistors. For example, the transistors 406 and 408 can be similar to the transistors 202, 204, 206, 208 and 210 shown in FIG. 2. Therefore all of the transistors used to construct the DFF circuit 400 can include IGZO circuitry. The DFF circuit 400 can be used in an electronic display. In some implementations, the DFF circuit 400 can be fabricated in the same manufacturing process used to fabricate circuits for controlling display elements of the electronic display.

The inverter circuit 200 shown in FIG. 2 can be used to implement a row driver for an electronic display. A row driver can be used in connection with a column driver to load image data into the display. For example, the display can include a two-dimensional array of pixels arranged in rows and columns. An image can be formed by controlling the brightness or color displayed by each pixel.

In some implementations, the brightness of a pixel can be changed by changing the position of a shutter assembly corresponding to the pixel. The column driver can couple to a plurality of data interconnects, each of which is coupled to the pixels in a corresponding column of the electronic display. The row driver can couple to a plurality of scan-line interconnects, each of which connects to the pixels in a corresponding row of the display. By applying a voltage to a given scan-line interconnect, the row driver can enable a row of pixels to accept a signal corresponding to image data applied to the data interconnects by the column driver.

To generate an image, data corresponding to the image is loaded into each pixel of the display in a row by row fashion. For example, the row driver can enable a first row of pixels by applying an enable signal to the scan-line interconnect corresponding to the first row. The column driver can then load image data into each pixel of the enabled first row by applying appropriate voltages on each data interconnect. In some implementations, the voltages applied by the column driver correspond to the desired positions of shutter assemblies for each pixel. After all of the image data has been loaded into the first row, the row driver can disable the first row and enable a second row. The column driver can then load image data into the second enabled row. This process can be repeated until each pixel in the display has received image data from the column driver. Further implementations of example row and column drivers formed using inverter circuits similar to the inverter circuit 200 shown in FIG. 2, the buffer circuit 300 shown in FIG. 3, and the DFF circuit 400 shown in FIG. 4 are described below in connection with FIGS. 5A and 5B.

Figure 5A:
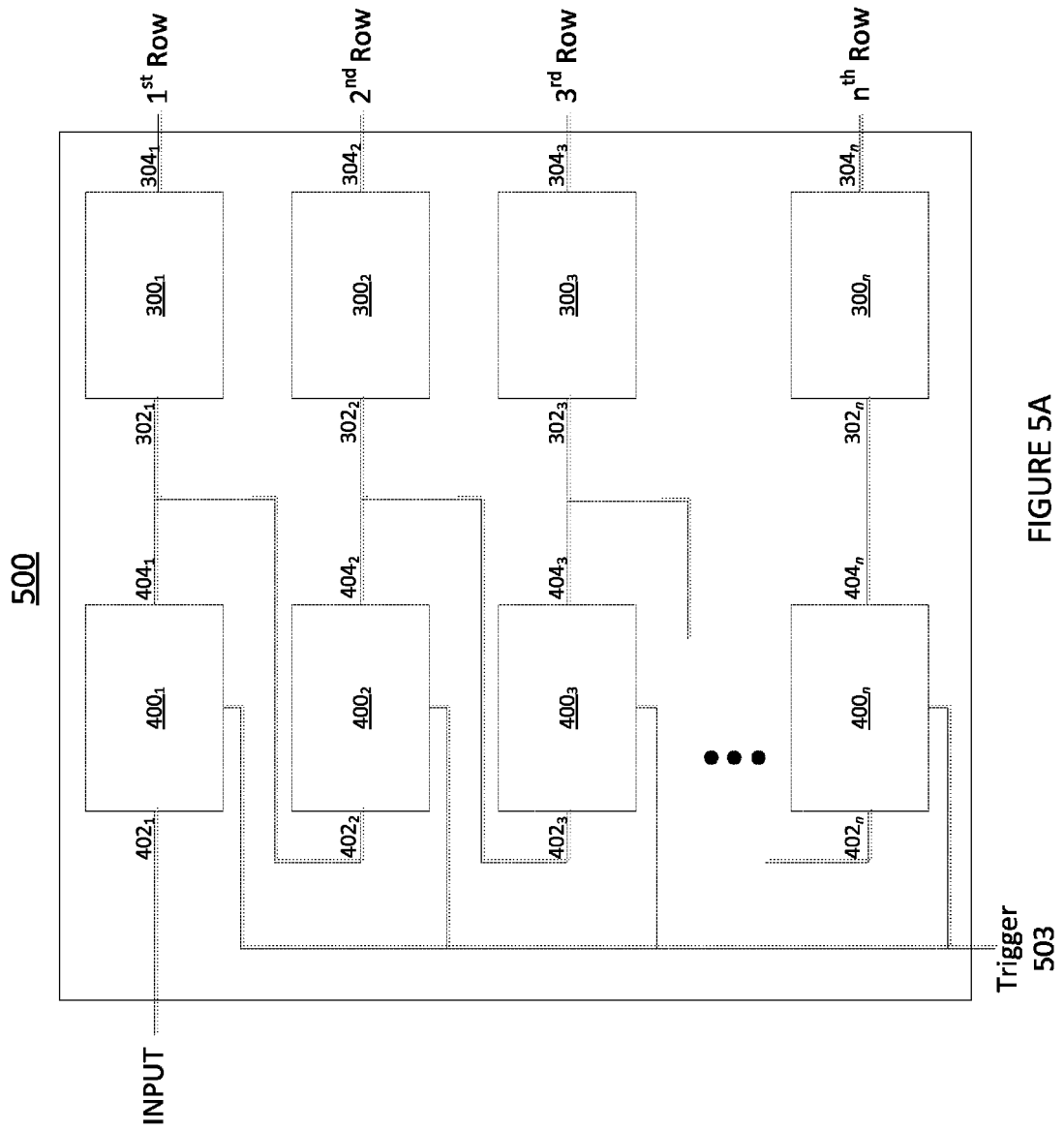
FIG. 5A shows a block diagram of an example row driver for an active matrix display.

FIG. 5A shows a block diagram of an example row driver 500 for an active matrix display. In some implementations, the row driver 500 can address elements in a display by applying voltages to the gates of transistors representing display elements. The row driver 500 is implemented using the buffer circuit 300 shown in FIG. 3 and the DFF circuit 400 shown in FIG. 4. The row driver 500 includes a plurality of DFF circuits $400_1$-$400_n$ (generally referred to as DFF circuits 400) and a plurality of buffer circuits $300_1$-$300_n$ (generally referred to as buffer circuits 300). Each DFF circuit ($400_1$/$400_2$/$400_3$/$400_n$) is connected at its output ($404_1$/$404_2$/$404_3$/$404_n$) to the input ($302_1$/$302_2$/$302_3$/$302_n$) of a respective buffer circuit ($300_1$/$300_2$/$300_3$/$300_n$). A common trigger signal 503, similar to the trigger signal 403 described in relation to FIG. 4, connects in parallel to each of the DFF circuits $400_1$-$400_n$. The input $402_1$ of the first DFF circuit $400_1$ is coupled to a programmable input signal. The inputs $402_2$-$402_n$, of the subsequent DFF circuits $400_2$-$400_n$, are coupled to the outputs 404 of the preceding DFF circuits 400.

The row driver 500 can be used to address an electronic display. As described above, an electronic display can include a plurality of display elements arranged in rows and columns. The state of each display element can be represented by a voltage. To create an image, image data is converted into a respective voltage for each display element. In some implementations, the voltages can be digital voltages representing logical 1s and 0s.

A column driver can store image data (such as voltages) corresponding to each display element in a given row. The stored voltages can be loaded into the row, and the column driver can then be programmed to receive and store image data corresponding to each display element in the subsequent row. Data values for the display elements can thus be loaded row by row until each display element in all rows has been populated. In some implementations, a column driver can load image data into a display element by applying a voltage corresponding to the image data to a terminal of a transistor coupled to the display element.

The row driver 500 can be used to sequentially select rows of the display into which data can be loaded by the column driver. For example, when the input signal on input $402_1$ corresponds to a logical 1, the DFF circuit $400_1$ stores the logical 1 at the first rising edge of the trigger signal 503, as described above in connection with FIG. 4. The DFF circuit $400_1$ then outputs a logical 1 at a second rising edge of the trigger signal 503. Because the output $404_1$ is coupled to the input $302_1$ of the buffer $300_1$, the voltage at the output $304_1$ also corresponds to a logical 1 until the next rising edge of the trigger signal 503 (assuming the input data has changed). The logical 1 on the output $304_1$ can therefore be used as an enable signal, enabling display elements in the first row to receive and respond to image data output by the column driver. The input signal $402_1$ can then be reset to a logical 0, which the DFF circuit $400_1$ subsequently passes through to the output $404_1$ so that the data loaded into the first row remains unchanged while display elements in other rows are addressed.

In some implementations, the trigger signal 503 can be a cyclically repeating signal, such as a clock signal. Rising edges of a cyclic trigger signal 503 will occur at regular repeating intervals. The output $404_1$ is coupled to the input $402_2$ of the second DFF circuit $400_2$. Therefore, in implementations in which the trigger signal 503 is cyclic, when the output $404_1$ becomes a logical 1 in the second cycle of the trigger signal 503 (i.e., at the second rising edge of the trigger signal 503), as described above, this value is stored by the DFF circuit $400_2$. The output $404_2$ of the second DFF circuit $400_2$ therefore transitions to a logical 1 in the third cycle of the trigger signal 503 (when the output of the first DFF circuit $400_1$ returns to a logical zero), and a logical 1 is present at the output $304_2$ of the buffer circuit $300_2$. The output $304_2$ enables the display elements in the second row to receive data from the column driver during the third cycle of the trigger signal 503. In subsequent cycles of the trigger signal 503, the input $402_2$ receives voltages corresponding to a logical 0 because the input to the first DFF circuit $400_1$ has been reset to 0. Therefore, the output $304_2$ returns to outputting a logical 0, allowing the second row to store the data that has been loaded.

This process repeats for subsequent rows so that each row is enabled (via one of the outputs $304_3$-$304_n$) for a single cycle of the trigger signal 503. In some implementations, the trigger signal 503 can be controlled by a controller, such as the controller 134 shown in FIG. 1B. The same trigger signal 503 also can be used to control the column driver to ensure that image data for the next active row is available at the column driver before the row is enabled for writing. Because the DFFs $400_1$-$400_n$ and the buffer circuits $300_1$-$300_n$ can be fabricated using n-type transistors in a conductive oxide (or other thin-film) manufacturing process, the row driver 500 can be manufactured simultaneously with the display elements on a substrate forming a backplane for the electronic display.

Figure 5B:
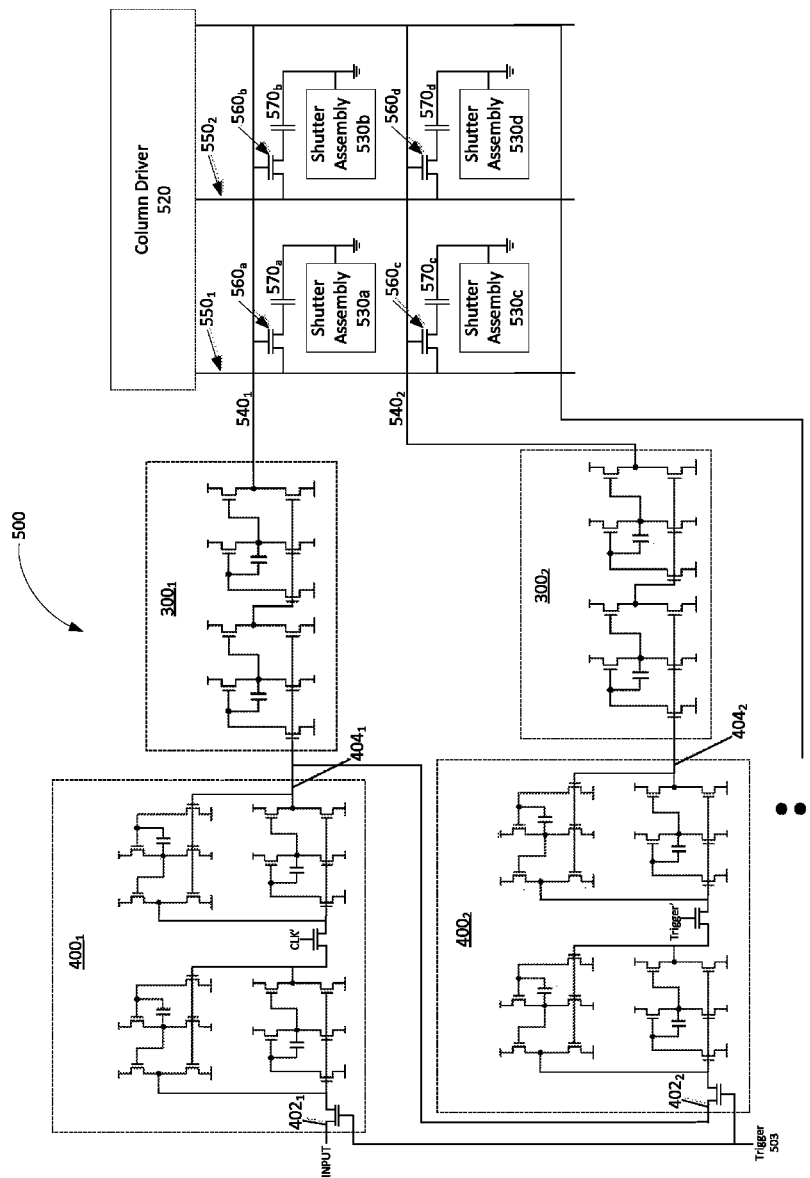
FIG. 5B shows a circuit diagram of the example row driver shown in FIG. 5A.

FIG. 5B shows a circuit diagram of the row driver 500 shown in FIG. 5A. The row driver 500 includes two DFFs $400_1$ and $400_2$ (generally referred to as DFFs 400) and two buffer circuits $300_1$ and $300_2$ (generally referred to as buffer circuits 300). While only two DFFs 400 and two buffer circuits 300 are shown in FIG. 5B, any number of DFFs 400 and buffer circuits 300 could be included in other implementations. For example, the row driver 500 can include a DFF circuit 400 and a buffer circuit 300 for each row of a display to which it is coupled. Also shown in FIG. 5B are a column driver 520 and a plurality of shutter assemblies 530a-530b (generally referred to as shutter assemblies 530). In some implementations, particularly for digital displays, the column driver 520 shown in FIG. 5B can be implemented using buffer circuits and DFF circuits similar to the buffer circuit 300 shown in FIG. 3 and the DFF circuit 400 shown in FIG. 4. Two scan-line interconnects $540_1$ and $540_2$ (generally referred to as scan line interconnects 540), as well as two data interconnects $550_1$ and $550_2$ (generally referred to as data line interconnects 550), couple to the row driver 500 and the data column driver 520, respectively. The scan line interconnects 540 and the data interconnects 550 also couple to respective transistors $560_a$-$560_d$ (generally referred to as transistors 560). The shutter assemblies 530 couple to the transistors 560 through respective capacitors $570_a$-$570_d$ (generally referred to as capacitors 570).

The row driver 500 and the column driver 520 can be used together to load image data into an electronic display composed of the shutter assemblies 530. The shutter assemblies 530 are arranged in rows and columns. The input signal and trigger signal 503 of the row driver 500 can enable sequential rows of shutter assemblies 530 to receive image data from the column driver 520. For example, each pair of DFF circuits 400 and buffer circuits 300 can be used to enable a row of shutter assemblies 530 to accept data from the column driver 520.

The outputs of the buffer circuits 300 couple to the scan-line interconnects 540. Each scan-line interconnect 540 couples in parallel to the gates of the transistors 560 associated with respective shutter assemblies 530. Similarly, the data interconnects 550 couple in parallel to drains of the transistors 560. The shutter assemblies 530 and transistors 560 are arranged in rows and columns such that a single enable line (i.e., scan-line interconnect 540) couples to all of the transistors 560 in a given row, and a single data line (i.e., data interconnect 550) couples to all of the transistors 560 in a given column.

When a high voltage (such as a voltage equivalent to a logical 1) is generated at the output of a buffer circuit 300, the high voltage is applied to the gate of each transistor 560 in a corresponding row of shutter assemblies 530, which turns ON all of the transistors 560 in that row. Each shutter assembly 530 in the row is therefore enabled to receive data from the column driver 520 through its respective transistor 560. For example, the column driver 520 can output signals on the data interconnects 550. Each output signal can correspond to image data to be output by the shutter assemblies 530. In some implementations, the column driver 520 can output data on one data interconnect 550 at a time, addressing each shutter assembly in the active row sequentially. In some other implementations, the column driver 520 can output data on the data interconnects 550 in parallel for the entire active row. The capacitors 570 in the active row can act as storage elements to store the voltages received from the column driver 520. In some implementations, the data voltages may be used to actuate the shutter assemblies 530 in the active row.

After each shutter assembly 530 in a row has been addressed, the row driver 500 can deactivate the row and enable a subsequent row. The addressing process for the subsequent row can then proceed in a fashion similar to the addressing process used for the first row. Successive rows can be enabled until each shutter assembly 530 in the display has been addressed.

For example, the output 404 of each DFF circuit 400 is coupled to the input 402 of the DFF circuit 400 corresponding to the next row and all of the DFFs 400 are coupled to a common trigger signal 503. Therefore, introducing a voltage corresponding to a logical 1 at the input $402_1$ to the first DFF circuit $400_1$ during a rising edge of the trigger signal 503 will enable the shutter assemblies 530a and 530b in the first row to receive data from the column driver 520. The output $404_1$ of the DFF circuit $400_1$ corresponds to a logical 1 during this time, and this value is therefore applied at the input $402_2$ of the second DFF circuit $400_2$. At the next rising edge of the trigger signal 503, the DFF circuit $400_2$ will store the logical 1 that is present at its input $402_2$, thereby enabling the shutter assemblies 530c and 530d to receive data from the data column driver 520.

Thus, the logical 1 introduced at the input $402_1$ to the first DFF circuit $400_1$ propagates through to subsequent DFFs 400 at successive rising edges of the trigger signal 503. In implementations in which the trigger signal 503 is a cyclic signal, such as a clock signal, the logical 1 introduced at the input $402_1$ to the first DFF circuit $400_1$ will propagate to successive DFFs 400 at regular repeating intervals with the same frequency as the clock signal. The input $402_1$ to the first DFF circuit $400_1$ can be reset to a logical 0 after one rising edge of the trigger signal 503, so that the first row is only enabled during one clock cycle. The logical 0 will propagate to the other DFFs 400 as described above. As a result, rows of the display will be enabled sequentially, and only one row will be enabled at any given moment, allowing the column driver 520 to transmit the correct image data to each of the shutter assemblies 530.

As discussed above, the row driver 500 is constructed primarily from n-type transistors that can be fabricated in a conductive oxide (or other thin-film) manufacturing process. In some implementations, the column driver 520, the shutter assemblies 530, and the transistors 560 also can be formed from conductive oxide circuitry. Therefore, the circuit layout shown in FIG. 5B, including the row driver 500, the column driver 520, the shutter assemblies 530, and the transistors 560 can be formed on a single substrate in the same manufacturing process. This can lead to cost savings and better performance as compared to other display circuits which may have many components that are manufactured in separate processes before they are electrically coupled in the electronic display.

Figure 6:
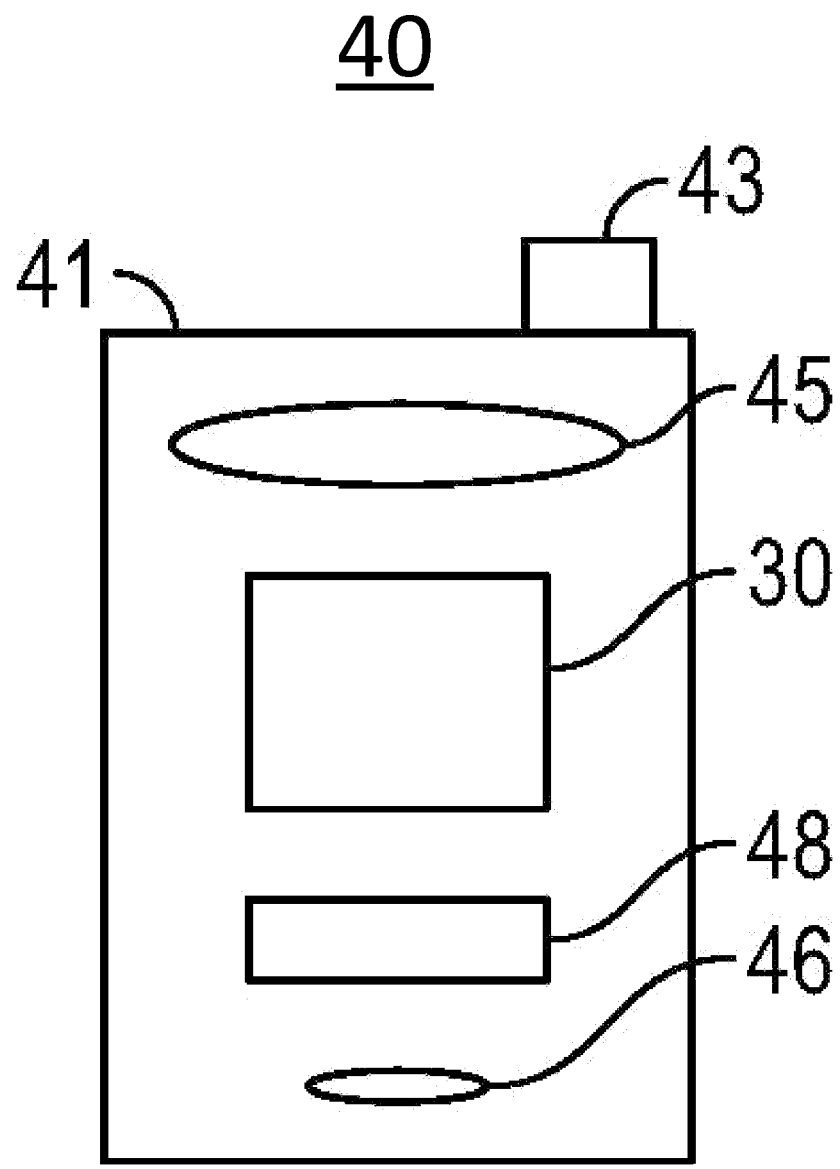
FIGS. 6 and 7 show system block diagrams of an example display device that includes a plurality of display elements.
Figure 7:
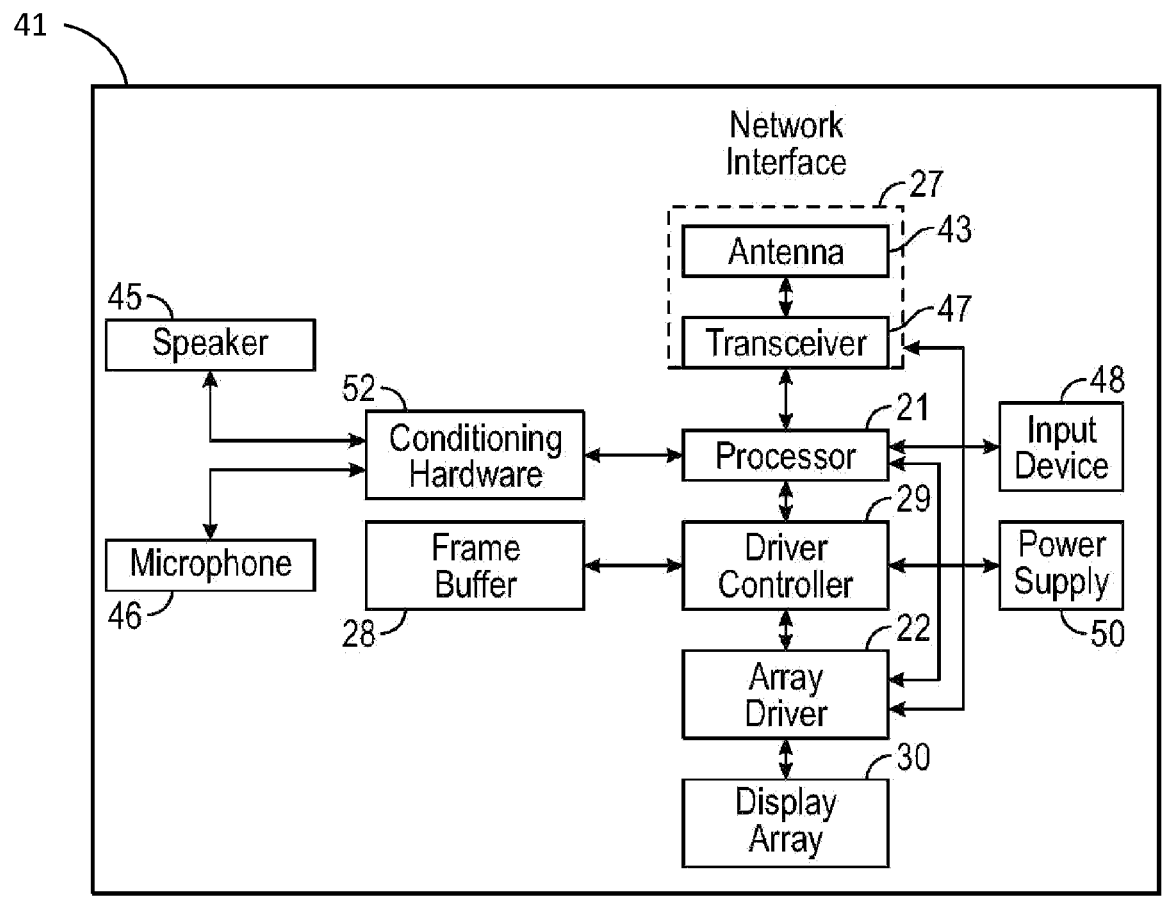

FIGS. 6 and 7 show system block diagrams of an example display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 7. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIGS. 6 and 7, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and grayscale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements. In some implementations, the array driver 22 and the display array 30 are a part of a display module. In some implementations, the driver controller 29, the array driver 22, and the display array 30 are a part of the display module.

In some implementations, the driver controller 29, the array driver 22, and the display array 30 are appropriate for any of the types of displays described herein. For example, the driver controller 29 can be a conventional display controller or a bi-stable display controller (such as a mechanical light modulator display element controller). Additionally, the array driver 22 can be a conventional driver or a bi-stable display driver (such as a mechanical light modulator display element controller). Moreover, the display array 30 can be a conventional display array or a bi-stable display array (such as a display including an array of mechanical light modulator display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c and a-b-c.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An all n-type thin film transistor (TFT) circuit, comprising:
   a first inverter including:
      an input voltage interconnect;
      an input TFT coupled at its gate to the input voltage interconnect and to a first low voltage source at its source;
      a pull-down TFT coupled to the input voltage interconnect at its gate and a second low voltage source at its source;
      a discharge TFT coupled to the input voltage interconnect at its gate and a third low voltage source at its source;
      a first pull-up TFT coupled from its source to the drain of the pull-down TFT and a first terminal of a capacitor, from its gate to the drain of the input TFT and a second terminal of the capacitor, and from its drain to a first high voltage source;
      a second pull-up TFT coupled from its source to the drain of the discharge TFT, from its gate to the source of the first pull-up transistor and to the first terminal of the capacitor and the drain of the pull-down TFT, and from its drain to a second high voltage source; and
      an output voltage interconnect coupled to a node between the second pull-up TFT and the discharge TFT,
      wherein the size of the pull-down TFT is larger than the size of the input TFT such that, in response to an input voltage on the input voltage interconnect transitioning from a voltage corresponding to a logical 1 to a voltage corresponding to a logical 0, the difference in input voltage feedthrough from the input TFT and the pull-down TFT is sufficient for the first pull-up TFT to switch from an OFF state to an ON state.

2. The circuit of claim 1, wherein the second low voltage source outputs a voltage that is more negative than a voltage output by first low voltage source.

3. The circuit of claim 1, wherein the first low voltage source is a ground.

4. The circuit of claim 1, wherein the first high voltage source outputs a voltage that is more positive than a voltage output by the second high voltage source.

5. The circuit of claim 1, wherein the first, second, and third low voltage sources and the first and second high voltage sources are DC voltage sources.

6. The circuit of claim 1, wherein the input TFT, the pull-down TFT, the discharge TFT, and the first and second pull-up TFTs are configured such that the voltage on the output voltage interconnect is the logical opposite of the voltage on the input voltage interconnect.

7. The circuit of claim 1, wherein the capacitor is a floating capacitor.

8. The circuit of claim 1, wherein the absolute value of the difference between a logical low input voltage and the voltage output by the second low voltage source is less than the threshold voltage of the first pull-up TFT.

9. The circuit of claim 8, wherein the logical low input voltage is equal to about the voltage output by the first low voltage source and the high input voltage is equal to the voltage output by the second high voltage source.

10. The circuit of claim 1, wherein at least one of the input TFT, the pull-down TFT, the discharge TFT, the first pull-up TFT and the second pull-up TFT include a channel including a conductive oxide.

11. The circuit of claim 1, wherein the voltage output by the first low voltage source is about equal to the voltage output by the third low voltage source.

12. The circuit of claim 1, further comprising a second inverter, wherein the output voltage interconnect of the first inverter is electrically coupled to an input voltage interconnect of the second inverter such that the first and second inverters together operate as a buffer.

13. The circuit of claim 1, further comprising:
   a sixth TFT coupled at its gate to a trigger signal, at its drain to a data input interconnect, and at its source to the input voltage interconnect of the first inverter;
   a second inverter coupled at its input voltage interconnect to the output voltage interconnect of the first inverter, and at its output voltage interconnect to the input voltage interconnect of the first inverter;
   a seventh transistor coupled at its gate to an inverted trigger signal and at its drain to the output voltage interconnect of the first inverter circuit;
   a third inverter coupled at its input voltage interconnect to the source of the seventh transistor and the output voltage interconnect of a fourth inverter, and at its output voltage interconnect to the input voltage interconnect of the fourth inverter, wherein the first inverter, the second inverter, the third inverter, the fourth inverter, the sixth transistor, and the seventh transistor form a D flip-flop.

14. The circuit of claim 1, further comprising:
   a display;
   a processor that is configured to communicate with the display, the processor being configured to process image data; and
   a memory device that is configured to communicate with the processor.

15. The circuit of claim 14, further comprising:
   a driver circuit configured to send at least one signal to the display; and
   a controller configured to send at least a portion of the image data to the driver circuit.

16. The circuit of claim 14, further comprising:
   an image source module configured to send the image data to the processor, wherein the image source module comprises at least one of a receiver, transceiver, and transmitter; and
   an input device configured to receive input data and to communicate the input data to the processor.

* * * * *